United States Patent [19]

Naiff

[11] Patent Number: 4,480,320

[45] Date of Patent: Oct. 30, 1984

[54] COMPACT ROM WITH REDUCED ACCESS TIME

[75] Inventor: Kenneth L. Naiff, Hauppauge, N.Y.

[73] Assignee: General Instrument Corp., Clifton, N.J.

[21] Appl. No.: 383,709

[22] Filed: Jun. 1, 1982

[51] Int. Cl.³ ............................................. G11C 11/40
[52] U.S. Cl. .................................. 365/189; 365/230; 365/104
[58] Field of Search ............... 365/189, 104, 182, 203, 365/230

[56] References Cited

U.S. PATENT DOCUMENTS 4,344,156 8/1982 Eaton, Jr. et al. .

Primary Examiner—Terrell W. Fears
Attorney, Agent, or Firm—James & Franklin

[57] ABSTRACT

Access time is reduced by isolating the relatively high impedance stack, formed of series connected driver transistors, from a relatively high capacitive output. The driver transistors are either enhancement mode or depletion mode transistors, depending upon the information to be represented thereby. An isolation transistor has its control terminal connected to the stack through a control node and its output circuit connected between the output node and ground. The output node is connected through a load to a positive voltage. A switched ground technique is used to charge the control node prior to addressing. During readout, if any of the series connected driver transistors in the selected stack are not rendered conductive, due to the level of the address signals applied thereto, the control node remains charged causing the isolation transistor to remain conductive and the output node is thus discharged. To increase density, multiple stacks are connected in parallel to a single isolation transistor.

31 Claims, 5 Drawing Figures

COMPACT ROM WITH REDUCED ACCESS TIME

The present invention relates to read only memories (ROMs) and, more particularly, to a serial stack read only memory with reduced access time.

A read only memory is an electronic information storage device. Unlike erasable memories, a read only memory is fabricated to contain information which is defined by the structure of the memory and, thus, the information therein cannot be altered. Such a memory has the advantage of retaining the stored information therein without the necessity of periodic refreshing. In the event of a power disruption, the information contained in the memory is therefore not lost.

As with other types of electronic memories, it is desirable to fabricate a read only memory to maximize the amount of information which can be stored on a given area on a chip. Thus, fabrication techniques have been developed to increase the number of memory units per given area and enhance the density of the memory.

For example, silicon gate technology utilizing a self-aligned gate structure has reduced the space required on the chip by about 20%–30%, as compared with memories employing aluminum gate metal oxide semiconductor transistors. For this reason, read only memories employing silicon gate fabrication techniques are currently widely used.

In the *I.E.E.E. Journal of Solid-State Circuits* of June 1976, Hiroto Kawagoe and Nobuhiro Tsuji published an article entitled "Minimum Size ROM Structure Compatible With Silicon-Gate E/D MOS LSI", in which a new read only memory structure was disclosed. In the new structure, a cascade ratioless circuit configuration is used. The content of a memory cell is determined by the choice of the transistor threshold mode, that is, either enhancement or depletion, as contrasted to the conventional read only memory structure where the content of a memory cell is distinguished by the existence or absence of an operable transistor. The authors claim that this fabrication technique can reduce the size of the read only memory by 45%, as compared to conventional silicon gate read only memories.

The conventional read only memory consists of a plurality of flip-flop circuits, address decoders, and a matrix array of memory units. The flip-flop circuits are utilized to hold an address in the memory unit matrix with a binary code. The address decoders are utilized to select the row and column of the particular memory unit which is to be read.

Each of the conventional-type memory columns consists of a plurality of memory units which are connected in parallel. The state of each memory unit is distinguished by the existence or absence of an operable transistor. If P channel metal oxide semiconductor transistors are used, the signal read-out is performed by applying a low level signal (near the negative power supply voltage) to the selected address line. A high level signal (nearly zero volts) is applied to all of the non-selected address lines.

If the selected transistor is non-operable, that is, has a thick gate oxide, the application of the low level signal to the control terminal thereof will not render the transistor conductive and, thus, a pre-charged output node will not be discharged. On the other hand, if a functioning transistor has been selected, that is, one with a thin gate oxide, the application of the address signal to the control terminal thereof will render the transistor conductive, thereby discharging the pre-charged output node. Thus, whether the output node is discharged or not indicates whether an operable transistor existed at the addressed location.

The Kawagoe/Tsuji read only memory structure disclosed in the article uses both enhancement mode and depletion mode transistors for the memory units. Design and fabrication are simplified because no through holes are required. The size of a single bit of the memory is substantially reduced and the necessity for an aluminum layer in the matrix is eliminated.

The Kawagoe/Tsuji read only memory uses a cascade ratioless circuit configuration which consists of enhancement mode and depletion mode silicon gate semiconductor transistors, connected in series as driver elements to form a stack, instead of the conventional parallel configuration. The depletion mode transistors act as resistors between the enhancement mode transistors. The mode of the transistor, that is, whether same is enhancement or depletion, is selected in accordance with the information to be defined at the location of the particular transistor. Because of this arrangement, the structure of the chip is significantly simplified and, thus, the size of the random access memory is greatly reduced.

While the read only memory structure proposed by Kawagoe and Tsuji is a significant improvement over the conventional silicon gate read only memory, it has a significant drawback. In order to obtain a memory of reasonable size, each stack must be relatively long. The large number of series connected driver transistors form a circuit with a relatively high impedance. When this high impedance circuit is connected directly to a high capacitive load, as it is in the Kawagoe/Tsuji read only memory, a relatively high discharge time results. In the example in the article, each stack comprises 48 silicon gate semiconductor driver transistors connected in series. This circuit is directly connected to drive a load of approximately 1.5 pF, resulting in a delay time of approximately 2 microseconds.

In view of this, it can be readily appreciated that there is a direct relationship in the Kawagoe/Tsuji memory between the number of series connected transistors in the stack and the memory delay time. As the number of transistors in the stack increases, so does the delay time. Thus, it would be a significant achievement if this relationship could be circumvented because larger memories would result with no sacrifice in response time.

This relationship is circumvented in the present invention through the use of an isolation transistor, interposed between the series connected driver transistors and the output node. The control node of the isolation transistor is connected to the series connected drivers. The output circuit is connected between ground and the output node. The output node is connected through a load to a source.

Prior to addressing, the control node of the isolation transistor is precharged to render the isolation transistor conductive. If all of the transistors in the stack are rendered conductive when addressed, the control node of the isolation transistor is grounded through the drivers, thereby dissipating the precharge, the isolation transistor is rendered non-conductive and the output node remains charged. Otherwise, the isolation transistor remains conductive and the output node is rapidly discharged to ground through the output circuit of the isolation transistor.

With this system, the time it takes for the output node to discharge is a function of the size of the isolation transistor. In order to obtain a short discharge time, the isolation transistor must be relatively large. However, the isolation transistor cannot be too large because the larger the isolation transistor, the greater the capacitance of the output circuit and, hence, the higher the discharge time.

With the size of the isolation transistor selected for maximum speed, it becomes evident that the isolation transistor is too large to permit maximum circuit density if one isolation transistor is provided for each stack. I have therefore designed the circuit such that the driver transistor concentration is enhanced by utilizing a single isolation transistor for multiple columns of series connected driver transistors.

This is accomplished by interposing selection transistors between the isolation transistor and multiple stacks. These transistors select, in accordance with selection signals, a single one of the stacks for connection to the isolation transistor. In this manner, both high speed and high density are achieved simultaneously.

It is, therefore, a prime object of the present invention to provide a highly compact read only memory with significantly reduced access time.

It is another object of the present invention to provide a compact read only memory with reduced access time wherein the relatively high impedance circuit formed by the series connected driver transistors is isolated from the relatively high capacitive load of the output.

It is another object of the present invention to provide a compact read only memory with reduced access time wherein the number of transistors in each series connected circuit can be increased without resulting in significantly increased delay times.

It is another object of the present invention to provide a compact read only memory with reduced access time wherein a single isolation transistor is utilized to isolate the selected stack from the output.

It is an other object of the present invention to provide a compact read only memory with reduced access time wherein the control node associated with the isolating transistor is charged using a switched ground technique.

It is another object of the present invention to provide a compact read only memory with reduced access time wherein the density of the memory is increased by providing only a single isolation transistor for a plurality of stacks.

In accordance with the present invention, the read only memory consists of a source of first potential, a control node, an output node normally maintained at a relatively high potential, and a plurality of driver transistors. Each driver transistor has a control terminal and an output circuit. The output circuits of the driver transistors are operably connected in series between the source and the control node, to form a relatively high impedance circuit. The output node is connected to a relatively high capacitive load. Means are provided for selecting a driver transistor and for applying a select signal to the control terminal thereof and non-select signals to the control terminals of the non-selected driver transistors, respectively. Means are provided for operatively isolating the control node from the output node. The isolation means is effective, when actuated, to prevent the output node from being discharged. Means are provided for charging the control node to a potential higher than the first potential, prior to the application of the select and non-select signals. The isolation means comprises an isolation transistor having its control terminal connected to the control node such that the isolation transistor is actuated only if the control node is operably connected to the first potential, through the driver transistors, when the select and non-select signals are applied. The output circuit of the transistor is connected between ground and the output node to discharge the output node, if the isolation transistor is actuated.

Preferably, the control node charging means comprises a switched ground source capable of supplying the first potential and a second potential to the control node, at the appropriate times. The second potential is applied to the control node prior to the application of the select and non-select signals to precharge the control node and render the isolation transistor conductive. During the time when the select and non-select signals are applied, the source switches to the first potential, preferably ground.

Means are provided between the switched ground source and the control node to prevent the control node from discharging to the first potential, through the switched ground source, when the source is at the first potential. Thus, if all of the series connected driver transistors are rendered conductive by the select and non-select signals, the control node will discharge, through the driver transistors, to the first potential and the output node will be isolated from the first potential by the non-conductive output circuit of the isolation transistor. Otherwise, the control node will maintain its charge and the output node will remain connected to the first potential, discharging same, because the isolation transistor will remain conductive.

A further refinement may be achieved by connecting the series connected driver circuit between the control node and the switched ground source, instead of the source of first potential. The effect is the same when the drivers are addressed because the switched ground source is at the first potential during this period. However, during the control node charging period, prior to the application of the select and non-select signals, the switched ground source is at the second potential to charge the control node. If all of the drivers are rendered conductive during the control node charging period, the second potential from the switched ground source will also be applied to the control node through the series connected drivers and, thus, tend to reinforce the charge on the control node.

Since the relatively high impedance circuit, formed by the large number of series connected driver transistors, is isolated from the high capacitive load of the output by the isolation transistor, the delay time is significantly reduced. Thus, it is expected that the present invention will permit the fabrication of large capacity read only memories with access times of about 200–300 nanoseconds, on a commercial scale.

In order to increase the density of the memory circuit, several stacks of series connected driver transistors are connected to a single isolation transistor through a circuit designed to select one of the stacks for accessing, in accordance with address signals. Each of these groups of stacks, and the selection circuit therefor, are referred to herein as a "page". For further economy of space, two pages may be associated with each isolation transistor. Page select means are utilized to select one of the pages for connection to the isolation transistor.

Thus, the address signals comprise page address signals, stack (column) address signals, and bit (row) address signals. The appropriate application of the address signals will permit accessing a single designated driver transistor.

In this manner, the relatively large isolation transistor, required for fast discharge of the output node, is associated with multiple stacks of series connected driver transistors. This substantially reduces the size of the circuit without any sacrifice in speed.

To the accomplishment of the above and to such other objects as may hereinafter appear, the present invention relates to a compact read only memory having reduced access time, as described in detail in the following specification and recited in the annexed claims, taken together with the accompanying drawings, wherein like numerals refer to like parts and in which:

Figure 1:
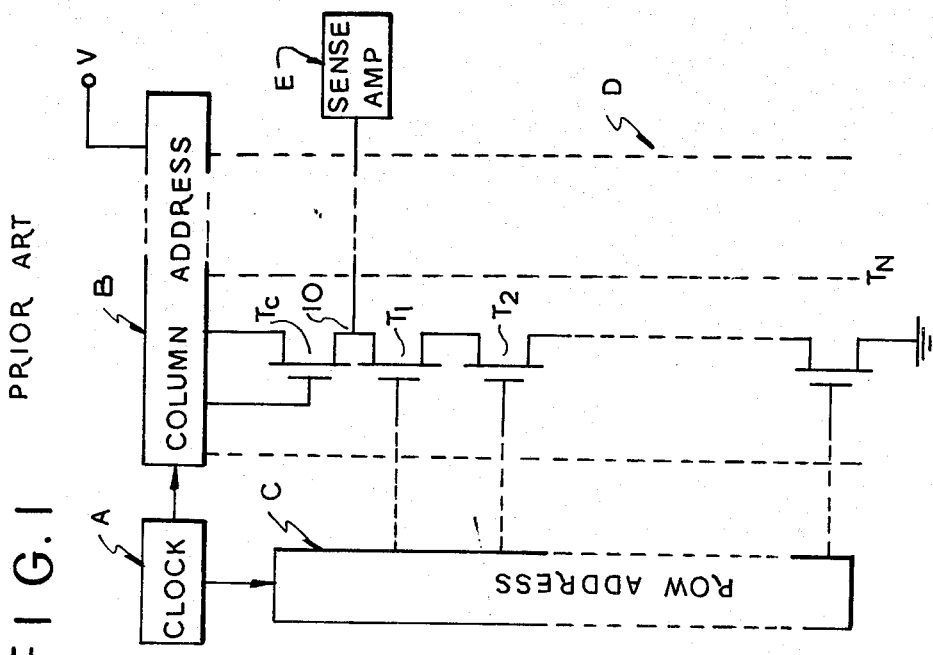
FIG. 1 is a schematic diagram of the Kawagoe/Tsuji read only memory circuit described in the article referred to above.

FIG. 1 is a schematic representation of the Kawagoe/Tsuji memory disclosed in the above-mentioned article. The memory comprises a timing circuit or clock, generally designated A, which is connected to a column address circuit, generally designated B, and a row address circuit, generally designated C. A matrix array of silicon gate semiconductor transistors, generally designated D, comprises a plurality of columns (only one of which is shown in detail) connected, respectively, to the outputs of column address circuit B. A plurality of row buses are connected to the respective outputs of row address circuit C. A separate sense amplifier, generally designated E, is provided for and connected to each column of the matrix D.

Each column of the matrix D comprises a plurality of P-channel transistors T, each having a control terminal and an output circuit. The output circuits of each of the transistors T are connected in series between ground and an output of column address circuit B. The first or topmost transistor T is designated as $T_C$ because the control terminal thereof is connected to the high level output of clock A, through column address circuit B. The other transistors in the column which act as drivers are designated $T_1, T_2 \ldots T_n$, respectively. Transistor $T_C$ acts as a load for driver transistors $T_1, T_2 \ldots T_n$. The control terminals of each of the driver transistors $T_1, T_2 \ldots T_n$ are, respectively, connected to row address circuit C. In this manner, a cascade ratioless circuit is formed.

Transistor $T_C$ is an enhancement mode transistor. The driver transistors $T_1 \ldots T_n$ consist of either enhancement mode or depletion mode transistors, depending upon the information to be defined thereby. When a particular column is selected by column address circuit B, the output circuit of load transistor $T_C$ is connected to a voltage source V and clock A applies a high signal to the control terminal of transistor $T_C$ so as to render same conductive. In this manner, output node 10 is charged to a level close to the level of a negative source V. The clock signal is then removed from the control terminal of transistor $T_C$ such that transistor $T_C$ is rendered non-conductive and output node 10 is isolated and, thus, remains charged. Row address circuit C is then actuated to apply a select signal to the control terminal of the selected driver transistor and non-select signals to the control terminals of each of the non-selected transistors, respectively. Preferably, the select signal is a relatively high level (near zero volts), and the non-select signals are of a relatively low level (negative).

For example, assume Transistor $T_2$ is selected and that transistor $T_2$ is a depletion mode transistor. Transistor $T_2$ remains conductive when the high level (zero) select signal is applied thereto. The non-selected enhancement mode transistors, in series with the selected transistor, are turned on by the low (negative) level of the non-select signals applied to their respective control terminals. The non-selected depletion mode transistors remain conductive. Thus, the output level to sense amplifier E is high (near zero volts) because the precharged output node 10 is discharged through the output circuits of transistors $T_1, T_2 \ldots T_n$ to a potential close to ground.

On the other hand, assume transistor $T_3$ is selected and that transistor $T_3$ is an enhancement mode transistor and thus normally non-conductive. The control terminal of transistor $T_3$ receives the select signal, whereas the control terminals of all of the other transistors, respectively, receive the non-select signals. The application of the select signal to the control terminal of transistor $T_3$ retains transistor $T_3$ in the non-conductive state. Thus, the output level applied to the input of sense amplifier E is low (negative) because there is no discharging path for the precharged data node 10.

Figure 2:
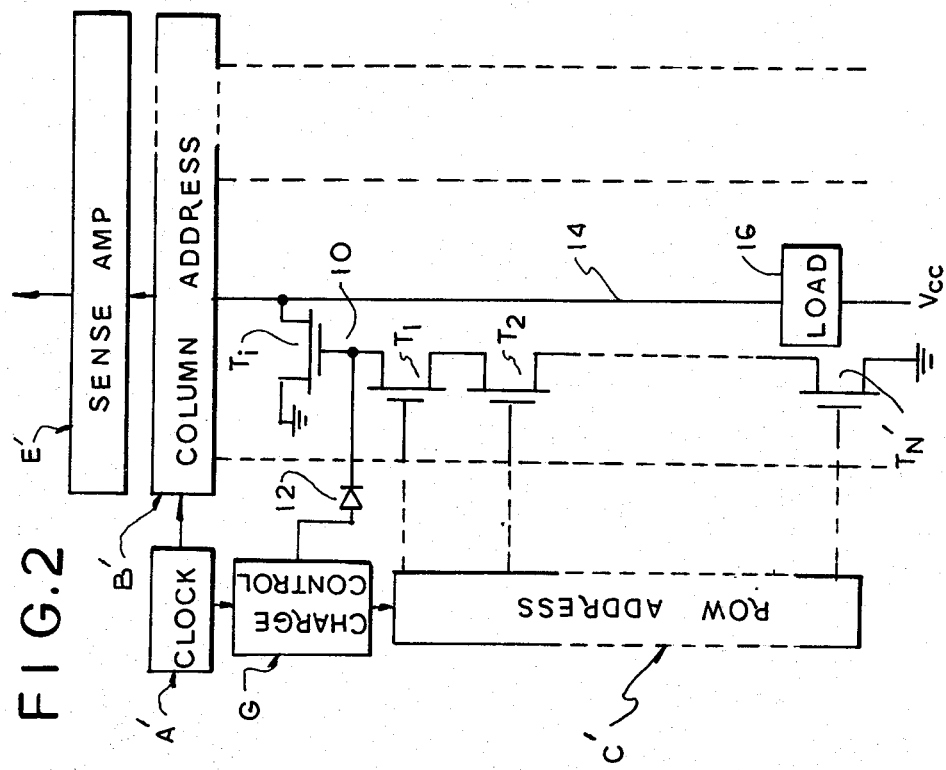
FIG. 2 is a diagram showing the basic concept of the read only memory circuit of the present invention.

FIG. 2 depicts the basic concept behind the improved read only memory circuit of the present invention. Where appropriate for comparison purposes, the same legend used in FIG. 1 is employed with a prime (') to designate a corresponding item in FIG. 2. The memory consists of a timing circuit or clock A', a column address circuit B', a row address circuit C', a memory transistor matrix array D', and a sense amplifier E', similar to those described with respect to FIG. 1. Again, only a single column is shown for clarity. In this case, a charging control circuit, generally designated G, employs a switch ground technique to generate high and low signals in the proper timed sequence. Circuit G is connected to control node 10' through a diode 12 and, prior to application of the address signals, applies a high signal to node 10' to precharge same. Column selection circuit B' connects the selected output line 14 to the input of sense amplifier E'. Line 14 is connected to a source $V_{CC}$ through load 16 and, thus, will be at a level near $V_{CC}$, unless discharged.

In accordance with the present invention, transistor $T_C$, which is the first transistor in each column of matrix D, as shown in FIG. 1, has been replaced by an isolation transistor $T_i$ which has a control terminal connected through control node 10' to the series connected output circuits of transistors $T'_1, T'_2 \ldots T'_n$ and an output circuit which is connected between ground and column output line 14. Transistor $T_i$ is an enhancement mode transistor and, therefore, is normally non-conductive. However, the application of a high signal on node 10', from charge control circuit G, renders transistor $T_i$ conductive so as to connect line 14 to ground. Transistors $T_1, T_2 \ldots T_n$ are either depletion mode or enhancement mode, N-channel transistors, depending upon the information defined thereby.

When the row and column select signals are applied, the output of charging control circuit G changes from high to low. However, control node 10' remains charged because diode 12 prevents the charge thereon from dissipating through control circuit G.

The row select signals include select signals which are low level (in this case, near zero volts) and non-select signals which are high level (in this case, positive). A select signal is applied to the control terminal of the driver transistor in the selected row while the control terminals of all of the other transistors receive the non-select signals.

If the select signal is applied to a depletion mode transistor, it remains conductive, the non-selected enhancement mode driver transistors are rendered conductive, and the non-selected depletion mode driver transistors remain conductive. Hence, control node 10', and thus the control terminal of transistor $T_i$, are connected to ground, turning transistor $T_i$ off so as to prevent the discharging of the output line 14 to ground through the output circuit of transistor $T_i$. Thus, sense amplifier E detects a high level output.

On the other hand, if an enhancement mode transistor is selected, this transistor will remain non-conductive, thus preventing control node 10' from discharging, and thus the control terminal of transistor $T_i$ from being connected to ground through the series connected output circuits of the driver transistors. In this case, transistor $T_i$ remains conductive and output line 14 is discharged to ground. Thus, sense amplifier E detects a low level input.

As illustrated in FIG. 2, each column or stack of the memory circuit is provided with a single isolation transistor $T_i$. However, the isolation transistor $T_i$ must be larger than the driver transistors in order to achieve the desired speed. It is therefore possible to significantly enhance the density of the memory circuit by using a single isolation transistor for multiple stacks or columns. The manner in which this is accomplished is described below and is the preferred form of the present invention.

It will be appreciated that transistor $T_i$ functions to isolate the series connected driver transistors $T'_1 \ldots T'_n$ from the output node 10'. This is important because the series connected driver transistors form a circuit with a relatively high impedance, because of the large number thereof. Since the output line 14 is connected to a relatively high capacitive load, connecting the output circuit directly to the series connected driver transisitors would result in a relatively long discharge time for line 14. This problem is eliminated in the present invention, in order to significantly reduce the delay time, by isolating or buffering the output line 14 from the series connected driver transistors by means of transistor $T_i$. In addition, it will be appreciated that transistor $T_i$ is connected so that it also serves to provide a second function, that is, output line 14 is discharged through its output circuit if the selected driver transistor is rendered conductive.

Further, by isolating the driver transistor circuit from the output load, the number of transistors in the driver transistor circuit may be increased without significantly increasing the delay time. Thus, the size of the memory is no longer restricted as it is in the Kawagoe/Tsuji circuit.

Figure 3:
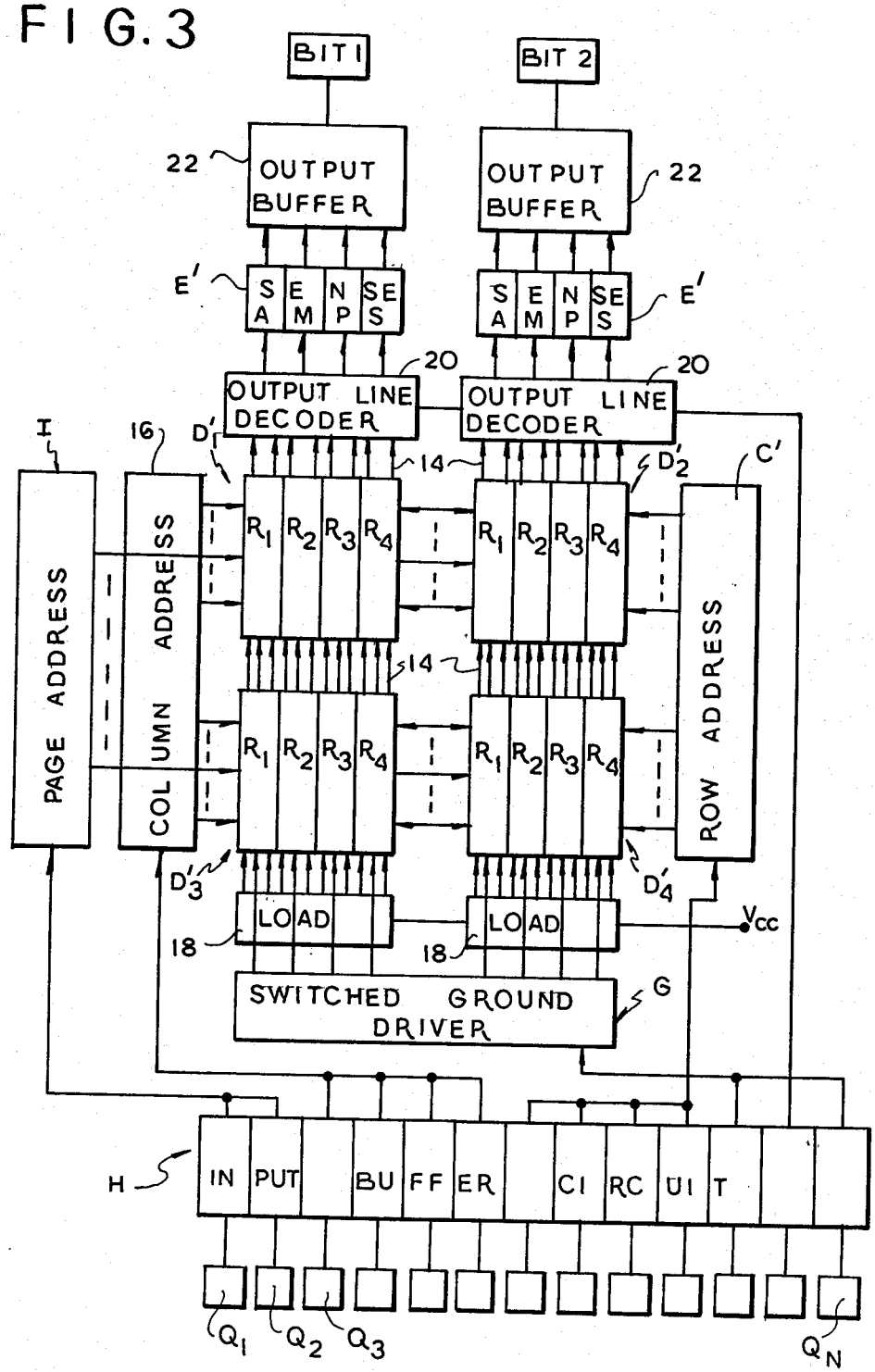
FIG. 3 is a block diagram of a read only memory employining the present invention.

FIG. 3 is a block diagram of a simplified read only memory employing the present invention. The read only memory depicted in FIG. 3 shows only a two bit memory. However, it should be understood that the memory can be expanded to include larger numbers of bits by simple duplication of parts, same being well within the ordinary skill in the art.

The matrix D' of memory cells is shown as comprising four separate sub-matrices, $D'_1 \ldots D'_4$, each represented by a rectangular box. Each pair of vertically aligned sub-matrices D contains the information for one memory bit. Each of the boxes D' contains four sub-divisions $R_1 \ldots R_4$. Each sub-division $R_1 \ldots R_4$, in turn, contains four pages, $P_1 \ldots P_4$, as described in detail below.

Each page P includes four parallelly situated columns or stacks, each of the columns or stacks comprising a plurality of series connected driver transistors $T'_1 \ldots T'_n$, which may either be enhancement mode or depletion mode transistors, depending upon the information contained therein. Each page P also contains column selection means and page select means. The column select means is designed to select a single column or stack and to connect same, through a page select means, to the control node, when the page select means is actuated.

Within each sub-division R of each sub-matrix $D'_1 \ldots D'_4$, there are two side-by-side pairs of vertically aligned pages P. The stacks in each vertically aligned page pair are operably connected, through their respective page select means and column select means, to a single control node 10'. The control node 10' is, in turn, connected to the control terminal of a single isolation transistor $T_i$. The output circuit of the isolation transistor $T_i$ is connected between ground and the column output line 14 provided for the vertically aligned page pair.

The peripheral circuitry includes a plurality of chip inputs $Q_1 \ldots Q_n$, each of which is connected to a different one of a plurality of input buffer circuits, respectively, which, in aggregate, are generally designated H. Each one of the input buffer circuits H has two outputs (only one of which is shown), generating separate but complementary signals, based on its input.

The outputs of one of the input buffer circuits H are applied to the input of a page address circuit, generally designated I. The page address circuit I receives complementary input signals and generates a pair of page select signals to each sub-division R in each set of horizontally aligned sub-matrices D'. Similarly, two of the input buffer circuits H are connected to the input of column address circuit 16. The two pairs of complementary outputs from column address circuit 16 are connected to each page P of each sub-division R in each set of horizontally aligned sub-matrices D' and serve to select one of four columns or stacks in the page. Row address circuit C' is also connected to the outputs of seven of the input buffer circuits H. In accordance with the complementary output signals from these input buffer circuits H, row address circuit C, which has a plurality of output lines, one for each driver transistor in each vertically aligned page P of each sub-division R of each set of horizontally aligned sub-matrices D', generates the select signal to the selected row and non-select signals to all other rows.

Figure 5:
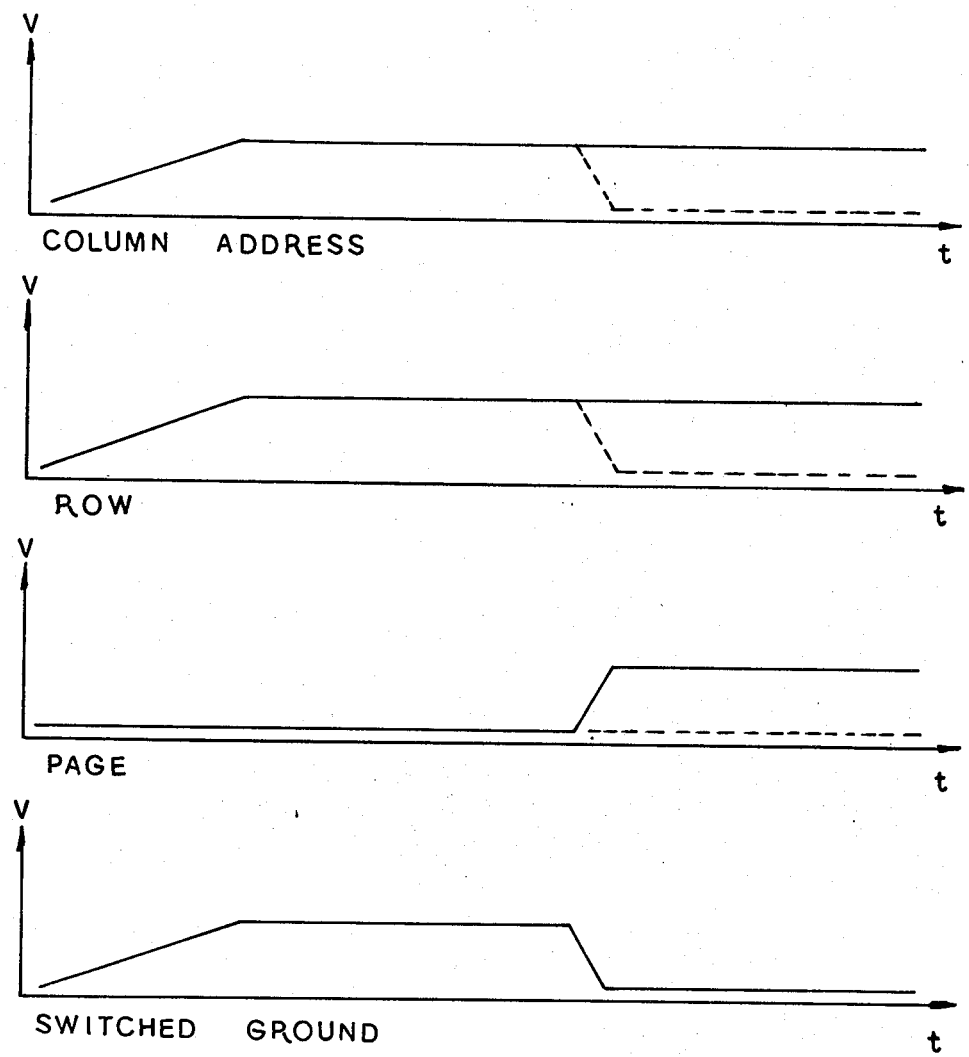

The switched ground driver circuit G is connected to the output of two of the input buffer circuits H to receive two pairs of complementary inputs, and generates a switched ground output to all vertically aligned sub-divisions R in each set of vertically aligned sub-matrices D'. The switched ground output and all column and row address output signals will be high prior to addressing, whereas the page address output signals will all be low prior to addressing, as illustrated in FIG. 5.

Each pair of vertically aligned pages in each sub-division R is provided with a column output line 14 which is connected between a load circuit 18 and an output line decoder circuit 20. Vertically aligned sub-divisions R share the same output lines 14. Each column output line 14 is connected through load 18 to a source of positive potential $V_{CC}$. Thus, all output lines 14 are normally at a positive potential.

An output line decoder circuit 20 is provided for each bit. Output line decoder circuits 20 are connected to one of the input buffer circuits H and function to connect a selected column output line 14 to one of four sense amplifiers in each sense amplifier circuit E', one of which is provided for each bit.

Each sense amplifier in each circuit E' is thus associated with one set of vertically aligned sub-divisions R in each of the vertically aligned sub-matrices D'. All of the four sense amplifiers in each of the circuits E' are connected to a single output buffer 22 for that bit.

Figure 4:
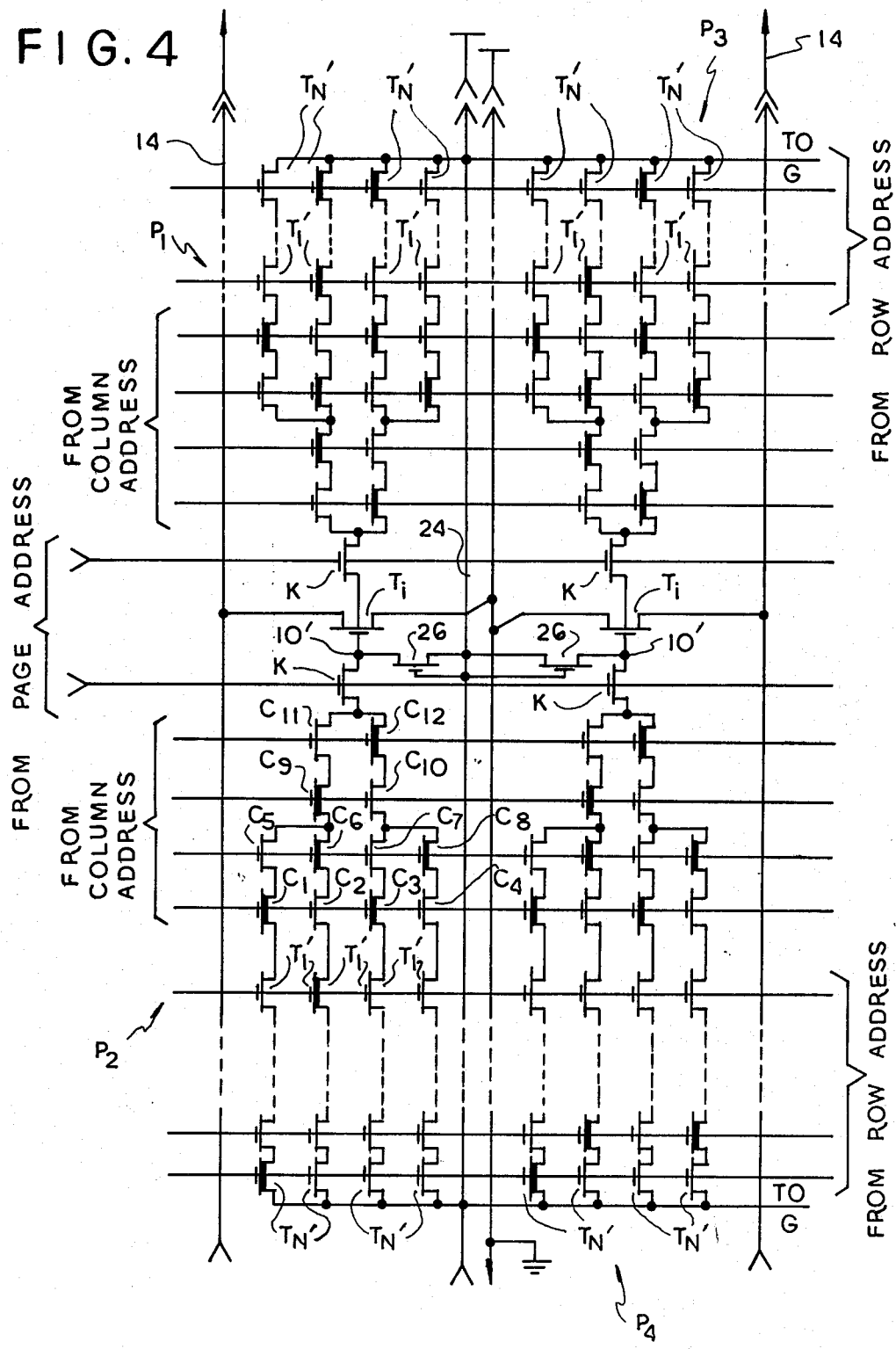
FIG. 4 is a schematic diagram of a portion of one of the memory arrays shown in FIG. 3; and, FIG. 5 is a timing diagram for the address and switched ground signals utilized in the memory illustrated in FIGS. 3 and 4.

The specific structure of each of the sub-divisions R can best be appreciated by referring to FIG. 4, which illustrates a typical sub-division R. FIG. 4 shows two pairs of vertically aligned pages $P_1 \ldots P_4$. Each page P comprises four parallel columns or stacks of series connected driver transistors $T'_1 \ldots T'_n$. Driver transistors $T'_1 \ldots T'_n$ are either enhancement mode or depletion mode transistors in accordance with the information to be contained in the memory. Throughout the figure, enhancement mode transistors are depicted as comprising a thin body portion and depletion mode transistors are depicted as comprising a thick body on the diagram.

Each of the four columns or stacks of driver transistors in each page P are connected between the output of switched ground driver circuit G and a column select means. Each of the column select means comprises four horizontal rows of transistors, each row receiving a different output from column address circuit 16. The horizontal row of column select transistors nearest the columns or stacks each consist of a depletion mode transistor $C_1$, an enhancement mode transistor $C_2$, a depletion mode transistor $C_3$, and an enhancement mode transistor $C_4$. The respective output circuits of transistors $C_1 \ldots C_4$ are connected between one of the columns or stacks on the one hand, and the transistors $C_5$ through $C_8$ on the other hand, which form the next row of the column select circuit. Transistor $C_5$ is an enhancement mode transistor, transistor $C_6$ is a depletion mode transistor, transistor $C_7$ is an enhancement mode transistor, and transistor $C_8$ is a depletion mode transistor.

The next horizontal row of transistors in the column select circuit consists of only two transistors $C_9$ and $C_{10}$. Transistor $C_9$ is a depletion mode transistor and $C_{10}$ is an enhancement mode transistor. The output circuit of transistor $C_9$ is connected to the output circuits of both transistors $C_5$ and $C_6$. Similarly, the output circuit of transistor $C_{10}$ is connected to the output circuits of transistors $C_7$ and $C_8$.

The fourth and last horizontal row of column select transistors comprises two transistors $C_{11}$ and $C_{12}$. The output circuit of transistor $C_{11}$ is connected between the output circuit of transistor $C_9$ and the output circuit of an enhancement mode page select transistor K. The output circuit of transistor $C_{12}$ is connected between the output circuit of transistor $C_{10}$ and the output circuit of page select transistor K.

The output circuit of page select transistor K is connected between the column select means and control node 10' which, in turn, is connected to the control terminal of the isolation transistor $T_i$, one of which is provided for each pair of vertically aligned pages P. Control node 10' is operably connected to the output of the switched ground driver circuit G through line 24 and a transistor 26. Transistor 26 has its control terminal also tied to the output of switched ground driver circuit G, via line 24, and thus functions as a diode similar to diode 12 shown in FIG. 2.

Prior to addressing, the output of switched ground driver circuit G is high such that control node 10' is charged to a high level through transistor 26. All page address signals are low. All column and row address signals are high. When all of the row address signals are high, all driver transistors are conductive, thereby connecting the output circuits of column select transistors $C_1$ through $C_4$ to the output of switched ground driver G through the respective stacks. When all of the column address signals are high, all of the stacks are connected to page select transistor K. At this point, any feed through page select transistor K would tend to dissipate the charge on control node 10' if transistor $T'_n$ of each stack were not connected to a source of high potential. It is for this reason that transistor $T'_n$ in each stack is connected to the output of switched ground driver G which is, during this period, at a high potential.

The output of switched ground driver circuit G now changes to a low level (ground) such that the end of each stack is connected to ground. However, the charge on control node 10' cannot dissipate through the switched ground driver circuit G because of transistor 26 which acts as a diode to prevent same. As the output of circuit G switches, the page, column and row select signals, and the output line decoder signals are generated and applied.

The selection process serves to select a row, a page, and to operably connect a selected stack or column in the selected page with the control node 10' associated with the selected page. For example, suppose the third driver transistor $T_3$ in the third column of page $P_2$, which appears on the lower left-hand corner of FIG. 4, is to be selected. A row select signal is applied to the third output line from row address circuit C'. All other row address output lines receive non-select signals. The page select signal applied to the page select transistors K for all pages in the lower half of all of the horizontally aligned sub-matrices D' will be high so as to render the corresponding page select transistors K conductive. The outputs on all other page select inputs will be low, keeping all other page select transistors K non-conductive, thereby disconnecting those pages from the corresponding control nodes 10'.

Four separate column select signals are applied to the four separate column select lines associated with the selected pages. In order to select the third column or stack of the page, the column select signal applied to column select transistors $C_1 \ldots C_4$ will be low, causing transistors $C_1$ and $C_3$ to remain conductive and transistors $C_2$ and $C_4$ to be non-conductive. The column select signal applied to the control terminals of column select transistors $C_5 \ldots C_8$ will be high such that transistors $C_5$ and $C_7$ will be rendered conductive and transistors $C_6$ and $C_8$ rendered non-conductive. The column select signal applied to the control terminals of transistors $C_9$ and $C_{10}$ will be high, thereby rendering transistor $C_9$ non-conductive and transistor $C_{10}$ conductive. The column select signal applied to the control terminals of transistors $C_{11}$ and $C_{12}$ will be low, such that transistor $C_{11}$ is turned off and transistor $C_{12}$ is turned on. Thus, column select transistors $C_3$, $C_7$, $C_{10}$ and $C_{12}$ will all be rendered conductive by the column select signals, thereby connecting the third column or stack, through conductive page select transistor K, with control node 10'.

The select row address signal applied to the control terminal of driver transistor $T_3$ is a low level signal and the non-select signals are high level signals. Thus, if the select signal is applied to a depletion mode transistor, the non-selected enhancement mode transistors are rendered conductive (non-selected depletion mode transistors remain conductive), and control node 10' is operably connected to the output of switched ground driver circuit G, which is ground, through the selected page select transistor K, the selected column select transistors $C_3$, $C_7$, $C_{10}$ and $C_{12}$, and the series connected driver transistors in the selected column or stack. In this way, the charge on control node 10' will dissipate through the switched ground driver circuit G, causing isolation transistor $T_i$ to become non-conductive. When isolation transistor $T_i$ becomes non-conductive, the column output line 14 associated with that isolation transistor becomes isolated from line 24 and, thus, from ground and thereafter rapidly charges to a positive potential, near $V_{CC}$, through load 18.

If, on the other hand, the selected driver transistor $T_3$ were an enhancement mode transistor, the application of the low level select signal thereto would not render same conductive. Therefore, the control node 10' would continue to be isolated from the grounded output of switched ground driver circuit G, control node 10' would maintain its charge, isolation transistor $T_i$ would continue to be conductive and function to connect the column output line 14 to ground, via line 24, preventing line 14 from charging to near the positive $V_{CC}$ level, through load 18.

Each of the column output lines 14 is connected through output line decoder circuit 20 to one of the sense amplifiers in sense amplifier circuit E'. Output line decoder circuit 20 is operably connected to the output of one of the input buffer circuits H, which causes the output line decoder circuit 20 to select only the column output line 14 of interest for connection to the corresponding sense amplifier in sense amplifier circuit E'. In this case, the column output line 14 of interest is the line shown on the lefthand side of FIG. 4. Thus, column output line 14 is connected through column decoder circuit 20 to the sense amplifier shown at the left of sense amplifier circuit E'. The sense amplifier senses whether the column output line 14 of interest is at a high level signal or a low level signal, after page, column and row selections have taken place. The sense amplifier generates a signal which is a function of the state of the sensed level on output line 14 and applies same to an output buffer circuit 22. Circuit 22 latches the output, by means of a bistable circuit and generates either a high or low level signal to represent the output of the addressed bit. Since the output buffer serves to latch the output signal corresponding to each bit, each bit in the memory can be addressed in sequence in order to read out a data word having a plurality of bits therein.

FIG. 5 graphically illustrates the time relationship between the column address, row address, page address and switched ground signals. Each graph shows maginitude plotted against time.

Prior to addressing, the column address and row address signals are all positive. Thus, all driver transistors and column select transistors are conductive. The switched ground signal is also positive prior to addressing, during the period when the control node is charged. The page address signals are, however, low during this period.

The page address signals are kept low during precharge to prevent any dissipation of charge from the control node through the stacks, which are conductive. However, even if some feed through the page select transistors should occur prior to addressing, dissipation of charge through the stack is prevented because the switched ground signal, also high during precharge, is connected to the far end of each stack.

When address occurs, the column address signals will remain high or become low, depending upon the column selected. The row address signals become low (select), or remain high (non-select). Page address signals either remain low or change to high.

The switched ground signals alternate between high, for control node precharge, and low, during addressing and information read-out. During the low period, control node charging ceases (but discharge through the switched ground driver is prevented) and discharge through the far end of each stack is possible.

It will now be appreciated that the present invention permits the fabrication of a read only memory having high density, rapid access time, and large capacity. Large capacity is obtained by isolating the high impedance stacks from the high capacitive load such that long stacks may be used without increasing the delay time significantly. High speed is achieved by using relatively large isolation transistors to permit rapid changes in the potential level of the output lines. High density results from the use of a single isolation transistor for multiple stacks. Thus, the present invention represents a significant improvement over the prior art in these three very important aspects.

While only a single preferred embodiment of the present invention has been disclosed herein for purposes of illustration, it is obvious that many variations and modifications could be made thereto. It is intended to cover all of these variations and modifications which fall within the scope of the present invention as defined by the following claims.

I claim:

1. A circuit suitable for use in a read only memory comprising a source of a first potential, a control node, an output node normally maintained at a relatively high potential, a plurality of driver transistors, each having a control terminal and an output circuit, said output circuits being operably connected in series between said source and said control node, means for selecting a driver transistor and for applying a select signal to the control terminal thereof and a non-select signal to each of the control terminals of the non-selected driver transistors, respectively, means for isolating said control node from said output node, said isolating means being effective, when actuated, to prevent said output node from discharging from said high potential, and means for charging said control node to a potential higher than the first potential, prior to the application of said select and non-select signals, said isolating means comprising an isolation transistor having an output circuit operatively connected between a reference potential and said output node and a control terminal operatively connected to said control node, said transistor being actuated if said control node is operatively connected to said source, through said series connected drivers, when said select and non-select signals are applied thereto.

2. The circuit of claim 1, wherein said charging means comprises a switched ground source.

3. The circuit of claim 2, wherein said switched ground source generates signals at said first potential and signals at said potential higher than said first potential, in timed sequence.

4. The circuit of claim 2, wherein said switched ground source comprises said source of said first potential.

5. The circuit of claim 2, further comprising means for operably connecting said switched ground source to said control node, said connecting means comprising means for preventing discharge of said control means through said switched ground source.

6. The circuit of claim 5, wherein said means for preventing discharge of said control node through said switched ground source comprises means for operatively isolating said control means from said switched ground source when said source generates signals at said first potential.

7. The circuit of claim 6, wherein said means for isolating said control node from said switched ground source comprises a diode.

8. The circuit of claim 1, further comprising a plurality of series connected driver transistor circuits connected in parallel with said plurality of driver transistors to form a group and means operatively interposed between said control node and said group for connecting a selected one of said driver transistor circuits to said control node.

9. The circuit of claim 8, wherein said connecting means comprises a transistor matrix operably connected between said control node and the respective driver transistor circuits in said group and effective to connect a selected one of said driver transistor circuits to said control node in accordance with column selection signals.

10. The circuit of claim 9, further comprising means for generating said column select signals and for applying same to said connecting means.

11. The circuit of Claim 8, further comprising a second group of parallel driver transistor circuits and a second means for connecting a selected one of said driver transistor circuits of said second group to said control node, each of said groups and said connecting means associated therewith forming a page, and means operatively interposed between said pages and said control node for connecting a selected one of said pages to said control node.

12. The circuit of claim 11, wherein said page connecting means comprises first and second page select transistors operably connected to connect one of said pages to said control node in accordance with page select signals.

13. The circuit of claim 12, further comprising means for generating said page select signals.

14. The circuit of claim 1, further comprising a plurality of series connected driver transistor circuits, connected in parallel with said plurality of driver transistors to form a group and wherein the control terminal of each driver transistor in each driver transistor circuit is operably connected to the control terminal of the corresponding driver transistor of each other driver transistor circuit in said group to form a row.

15. The circuit of claim 14, wherein each row of said operably connected control terminals is connected to a different output of said select signal applying means.

16. The circuit of claim 15, wherein the outputs of said select signal applying means are all high prior to the generation of said select and non-select signals.

17. The circuit of claim 16, wherein said select signals are low level and said non-select signals are high level.

18. The circuit of claim 1, wherein said select signals are low level and said non-select signals are high level.

19. The circuit of claim 12, wherein said page select signals are all low level prior to the application of said select and non-select signals.

20. The circuit of claim 9, wherein said column selection signals are all high level prior to application of said select and non-select signals.

21. The circuit of claim 1, further comprising means for normally maintaining said output node at said relatively high potential, said maintaining means comprises a source of relatively high potential and a load operably interposed between said source of high potential and said output node.

22. A read only memory comprising a switched ground source for generating a relatively high potential during a first time period and a relatively low potential during a second time period, a control node operatively connected to said source, such that said control node is charged to said high potential during said first period, an output node normally maintained at a relatively high potential, a plurality of parallel stacks, each of said stacks comprising a plurality of driver transistors each having a control terminal and an output circuit, the output circuits being connected in series, the control terminals of the corresponding driver transistors in each of said stacks being respectively aligned to form rows, stack selection means, one end of each of said stacks being connected to said source, the other end of each of said stacks being operatively connected through said stack selection means to said control node, means for selecting a row during said second period and for applying row select signals to said select row and row non-select signals to all non-selected rows, means for selecting a stack during said second time period and for applying stack select signals to said stack selection means to connect said one end of a selected stack to said control node, an isolating transistor having a control terminal connected to said control node and an output circuit connected between a reference potential and said output node, said isolating transistor being rendered conductive by the charge on said control node during said first period, and being rendered non-conductive to prevent the discharge of said output node if said selected stack is rendered conductive by said select and non-select signals, during said second time period and means for sensing the level of said output node during said second time period.

23. The memory of claim 22, further comprising a second plurality of parallel stacks and a second stack selection means, said second plurality of stacks having one end connected to said source and the other end connected to said control node through said second stack selection means.

24. The memory of claim 23, further comprising means interposed between said control node and said stack selection means for selecting one of said stack selection means and for operatively connecting same to said control node, in accordance with stack selection means selecting signals.

25. The memory of claim 22, further comprising means for connecting said source to said control node, said connecting means comprising a transistor functioning as a diode.

26. The memory of claim 24, wherein said stack select, row select and row non-select signals are all at a high level during said first time period.

27. The memory of claim 24, wherein all of said stack selection means selecting signals are low during said first time period.

28. The memory of claim 22, wherein said non-select signals are low level and said row non-select signals are high level during said second time period.

29. The memory of claim 23, wherein each of said plurality of parallel stacks and the associated stack selection means comprises a page and further comprising means interposed between said control node and said pages for selecting a page and connecting same to said control node.

30. The memory of claim 29, wherein said page selection means is responsive to page select signals and further comprising means for generating page select signals.

31. The memory of claim 30, wherein said page select signals are low level during said first time period.

* * * * *